United States Patent
Burl et al.

(10) Patent No.: US 6,396,271 B1
(45) Date of Patent: May 28, 2002

(54) TUNABLE BIRDCAGE TRANSMITTER COIL

(75) Inventors: Michael Burl, Chagrin Falls; Robert C. Gauss, Aurora, both of OH (US)

(73) Assignee: Philips Medical Systems (Cleveland), Inc., Highland Heights, OH (US)

( * ) Notice: Subject to any disclaimer, the term of this patent is extended or adjusted under 35 U.S.C. 154(b) by 0 days.

(21) Appl. No.: 09/397,826

(22) Filed: Sep. 17, 1999

(51) Int. Cl.[7] ................................. G01V 3/00
(52) U.S. Cl. .................. 324/318; 324/307; 324/322; 324/320; 324/309
(58) Field of Search ................. 324/318, 307, 324/322, 309, 300

(56) References Cited

U.S. PATENT DOCUMENTS

| | | | |
|---|---|---|---|
| 4,602,234 A | 7/1986 | Butson ..................... 335/299 |
| 4,692,705 A | 9/1987 | Hayes ....................... 324/318 |
| 4,820,987 A | 4/1989 | Mens ........................ 324/318 |
| 5,144,240 A | 9/1992 | Mehdizadeh et al. ....... 324/318 |
| 5,457,387 A | 10/1995 | Patrick et al. ............. 324/318 |
| 5,543,711 A | 8/1996 | Srinivasan et al. ........ 324/318 |
| 5,550,472 A | 8/1996 | Richard et al. ............ 324/320 |
| 5,602,479 A | 2/1997 | Srinivasan et al. ........ 324/318 |
| 5,664,568 A | 9/1997 | Srivivasan et al. ........ 324/318 |
| 5,990,681 A | * 11/1999 | Richard et al. ............ 324/318 |
| 6,043,658 A | * 3/2000 | Leussier .................... 324/318 |

* cited by examiner

*Primary Examiner*—Hezron Williams
*Assistant Examiner*—Dixomara Vargas
(74) *Attorney, Agent, or Firm*—Fay, Sharpe, Fagan, Minnich & McKee, LLP

(57) ABSTRACT

A tunable radio frequency birdcage coil (26, 34) has an improved tuning range for use with a magnetic resonance apparatus. The coil includes a pair of end ring conductors (60, 62) which are connected by a plurality of spaced leg conductors (L2, L4, . . ., L26) to form a generally cylindrical volume. Both the end rings and the leg conductors contain reactive elements, preferably capacitors (C2, C4, . . ., C124). The radio frequency coil also includes a pair of tuning rings (100, 120) for tuning the reactive elements (C2, C4, . . ., C124), which each include a non-conductive support cylinder (110, 130) and a plurality of tuning bands (120, 122, . . ., 142 and 150, 152, . . ., 172) which extend axially along the outer surface of the support cylinder (110, 130). The tuning rings (100, 120) are rotated or translated with respect to the leg conductors (L2, L4, . . ., L26) in order to vary capacitance and inductance of the coil (26, 34) to tune the (26, 34) coil to the desired resonant frequency.

21 Claims, 5 Drawing Sheets

TUNABLE BIRDCAGE TRANSMITTER COIL

BACKGROUND OF THE INVENTION

The present invention relates to the magnetic resonance arts. It finds particular application in conjunction with a radio frequency magnetic resonance coil which is tuned to the resonance frequencies of hydrogen (or other dipoles of interest) for anatomical, angiographic, functional and other medical imaging and will be described with particular reference thereto. It is to be appreciated, however, that the invention will also find application in animal studies, other non-human studies, spectroscopy, multiple dipole studies, very high field studies, multiple $B_0$ field systems, phased-array coil techniques, and the like.

Conventionally, magnetic resonance systems generate a strong, temporally constant static magnetic field, commonly denoted $B_0$, in a free space or bore of a magnet. This main magnetic field polarizes the nuclear spin system of an object. Polarized dipoles of the object then possesses a macroscopic magnetic moment vector preferentially aligned with the direction of the main magnetic field. In a superconducting main annular magnet assembly, the $B_0$ magnetic field is generated along a longitudinal or z-axis of the cylindrical bore. In an open system, the $B_0$ fields extends between a pair of spaced poles.

To generate a magnetic resonance signal, the polarized spin system is excited by applying a radio frequency field $B_1$, with a component perpendicular to the $B_0$ field. The frequency of the magnetic resonance signal is proportional to the gyromagnetic ratio $\gamma$ of the nuclei of interest times the magnetic field, e.g., 64 MHZ for hydrogen dipoles in a 1.5 Tesla magnetic field. In a transmission mode, the radio frequency coil is pulsed to tip the magnetization of the polarized sample away from the z-axis. As the magnetization precesses around the z-axis, the precessing magnetic moment generates a magnetic resonance signal which is received by the same or another radio frequency coil in a reception mode.

Conventionally, when imaging the torso, a whole body radio frequency coil is used in both transmit and receive modes. By distinction, when imaging the head, neck, shoulders, or other extremity, local coils are often used in conjunction with whole-body coils. Placing the local coil close to the imaged region improves the signal-to-noise ratio and the resolution. In some procedures, local coils are used for both transmission and reception.

One type of coil is known as the "birdcage" coil. See, for example, U.S. Pat. No. 4,692,705 of Hayes. Typically, a birdcage coil has a pair of circular end rings which are bridged by a plurality of equi-spaced straight segments or legs. In a primary mode, currents in the legs are sinusoidally distributed which results in good $B_1$ uniformity across the axis of the coil. $B_1$ uniformity can be further improved by increasing the number of legs in the coil. Capacitors typically interrupt the end rings between adjacent legs and are evenly distributed throughout the two end rings.

As transmit coils are used in higher magnetic fields and at higher power, there is an increased risk of local heating in the end-ring capacitors due to higher voltages and currents. In order to reduce the heating of the end-ring capacitors, additional capacitors are often added to the legs of the coil. While the additional capacitors aid in the lowering of voltage and the reduction of capacitor heating, tuning the coil to desired frequencies becomes problematic due to the cumulative large capacitance values at many positions on the coil. It is difficult to make a significant increment in capacitance with physically small capacitors, which in turn, diminishes the range over which the coil may be tuned.

Conventionally, birdcage resonators are tuned by making a small change to the value of resonating capacitors. This can be achieved by connecting variable capacitors in parallel with fixed value capacitors or by coupling a second nearly resonant circuit to the main coil and adjusting the reactance of the second circuit, typically by means of a variable capacitor. Again, the existence of large values of capacitance at many positions on the coil makes it difficult to adjust capacitance with physically small capacitors. Early birdcage coils typically had eight or sixteen legs with 32 capacitors. Today, many coils contain 20 or 24 legs and 120 or more capacitors. The increase in both capacitance and number of capacitors has made this coil resistant to resonant frequency tuning changes. In response to this problem, arrangements installing conductive foil segments around the end rings of the coil, which form a plurality of variable capacitors, have been employed. In addition, in a 3.0 Tesla $B_0$ magnetic field, hydrogen dipoles have a resonant frequency of 128 MHZ, which poses even further tuning problems.

The present invention contemplates a new and improved radio frequency coil design with enhanced tuning features which overcome the above-referenced problems and others.

SUMMARY OF THE INVENTION

In accordance with one aspect of the present invention, a magnetic resonance apparatus is provided. It includes a main magnet which generates a main magnetic field through an examination region. It further includes a tunable RF transmitter coil that is positioned about the examination region such that it excites magnetic resonance dipoles therein. An RF coil assembly receives magnetic resonance signals from the resonating dipoles. A radio frequency transmitter drives the tunable RF transmitter coil and a receiver is connected to the RF coil assembly which receives and demodulates the magnetic resonance signals. The tunable RF transmitter coil includes a pair of end ring conductors which are disposed in parallel planes and are connected by a plurality of spaced leg conductors. The end ring conductors are interrupted by a plurality of reactive elements and the leg conductors each contain at least one reactive element. The reactive element interrupting the leg conductors may be tuned by at least one tuning ring which comprises a non-conductive support cylinder and a plurality of tuning band conductors which extend axially along the non-conductive support cylinder.

In accordance with another aspect of the present invention, a method is provided for tuning a radio frequency coil used in a magnetic resonance apparatus, which coil includes spaced leg conductors electrically connected between two end rings disposed in a parallel spaced-apart relation. The end rings of the coil have at least one capacitance between each adjacent pair of leg conductors and the leg conductors are each interrupted by at least one capacitance. The method for tuning includes positioning a tuning ring containing conductive tuning pads in proximity to the capacitances in the leg conductors and at least one of rotating and translating the tuning ring in relation to the leg conductors and capacitances to adjust a resonant frequency of the coil.

In accordance with another aspect of the present invention, a radio frequency coil for a magnetic resonance apparatus is provided. The radio frequency coil includes a pair of end ring conductors which are connected by a plurality of parallel, spaced leg conductors arranged in a circumferential array. The end ring conductors and leg conductors are interrupted by a plurality of capacitances. The RF coil further includes a segmented conductive tuning ring which is movably positioned parallel to the end rings adjacent the leg conductors in at least one of a capacitively and inductively coupled relationship thereto, such that moving the tuning ring tunes a frequency of the radio frequency coil.

One advantage of the present invention is that it conveniently varies both capacitance and inductance of the RF coil.

Another advantage of the present invention is that it provides a wider tuning range.

Another advantage of the present invention is that a birdcage coil can be tuned to higher frequencies and used in higher magnetic fields and for higher power radio frequency pulses.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
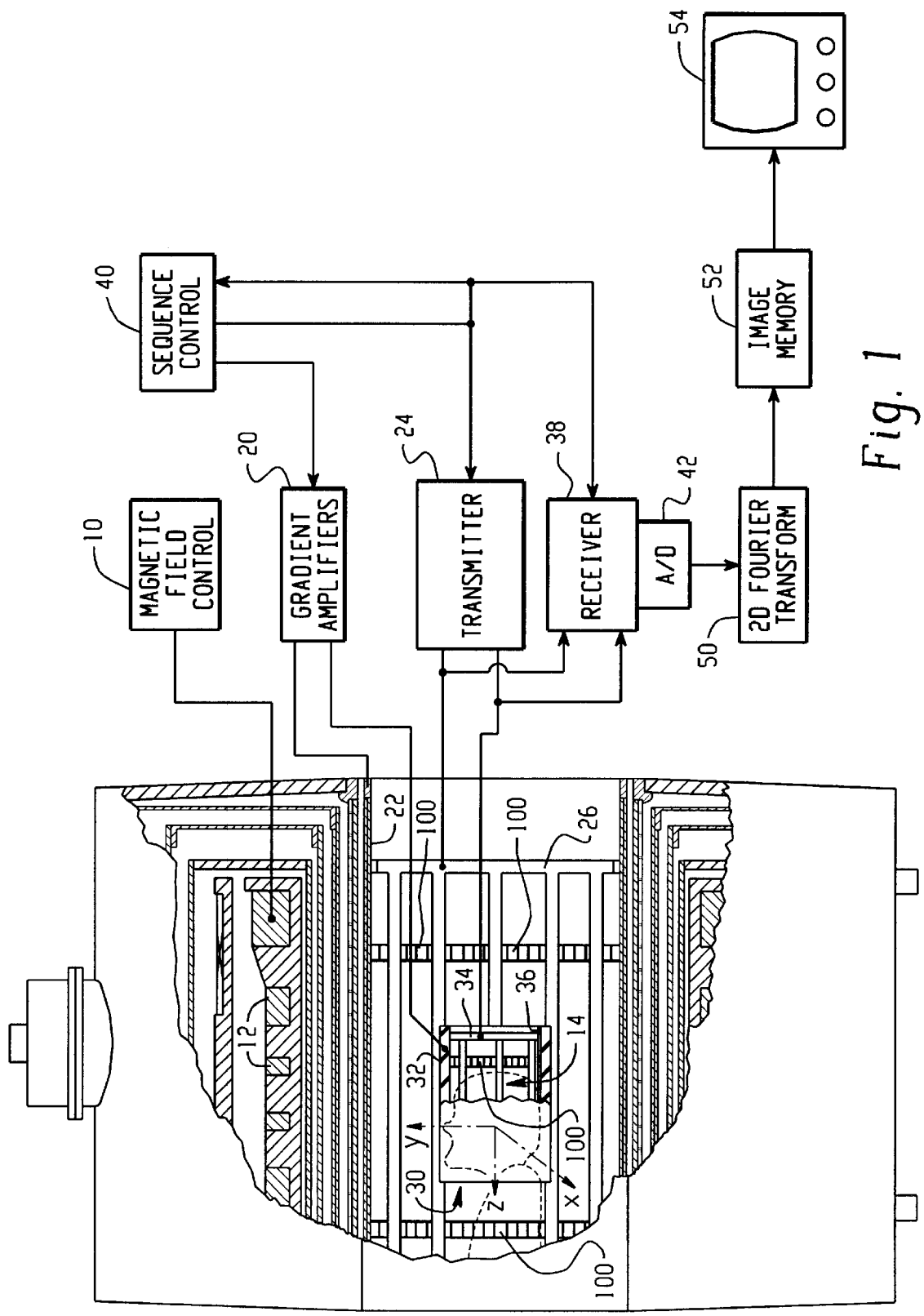
FIG. 1 is a diagrammatic illustration of a magnetic resonance imaging apparatus employing the tunable RF transmitter coil in accordance with the present invention.

With reference to FIG. 1, a main magnetic field control 10 controls superconducting or resistive magnets 12 such that a substantially uniform, temporally constant main magnetic field $B_0$ is created along a z-axis through an examination region 14. Although a bore-type magnet is illustrated in FIG. 1, it is to be appreciated that the present invention is equally applicable to open magnetic systems. A magnetic resonance sequence applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y and z-axes of the examination region 14. A radio frequency transmitter 24, preferably digital, transmits radio frequency pulses or pulse packets to a whole-body birdcage RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up in quadrature by the whole-body birdcage RF coil 26.

For generating radio frequency pulses into limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local birdcage radio frequency coil 34 is used to excite magnetic resonance. The local radio frequency coil 34 also receives magnetic resonance signals emanating from the selected region. An RF screen 36 screens the RF signals from the RF head coil from inducing any currents in the gradient coils and the surrounding structures. The resultant radio frequency signals are picked up in quadrature by the local RF coil 34 or other specialized RF coils and demodulated by a receiver 38, preferably a digital receiver.

A sequence control processor 40 controls the gradient pulse amplifiers 20 and the transmitter 24 to generate any of a plurality of magnetic resonance imaging and spectroscopy sequences, such as echo-planar imaging, echo-volume imaging, gradient and spin echo imaging, fast spin echo imaging, and the like. For the selected sequence, the receiver 38 receives a plurality of data lines in rapid succession following each RF excitation pulse. An analog-to-digital converter 42 converts each data line to a digital format. The analog-to-digital converter is disposed between the radio frequency receiving coil and the receiver for digital receivers and is disposed down stream (as illustrated) from the receiver for analog receivers. Ultimately, the demodulated radio frequency signals received are reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a display, such as a video monitor 54 which provides a human-readable display of the resultant image.

The frequency of the transmitter 24 and receiver 38 are set to the appropriate Larmor frequency range such that the desired species is excited, e.g., 64 MHZ for hydrogen dipoles in a 1.5 T magnetic field. Often, the center frequency for the RF transmitter coil is set manually.

Figure 2:
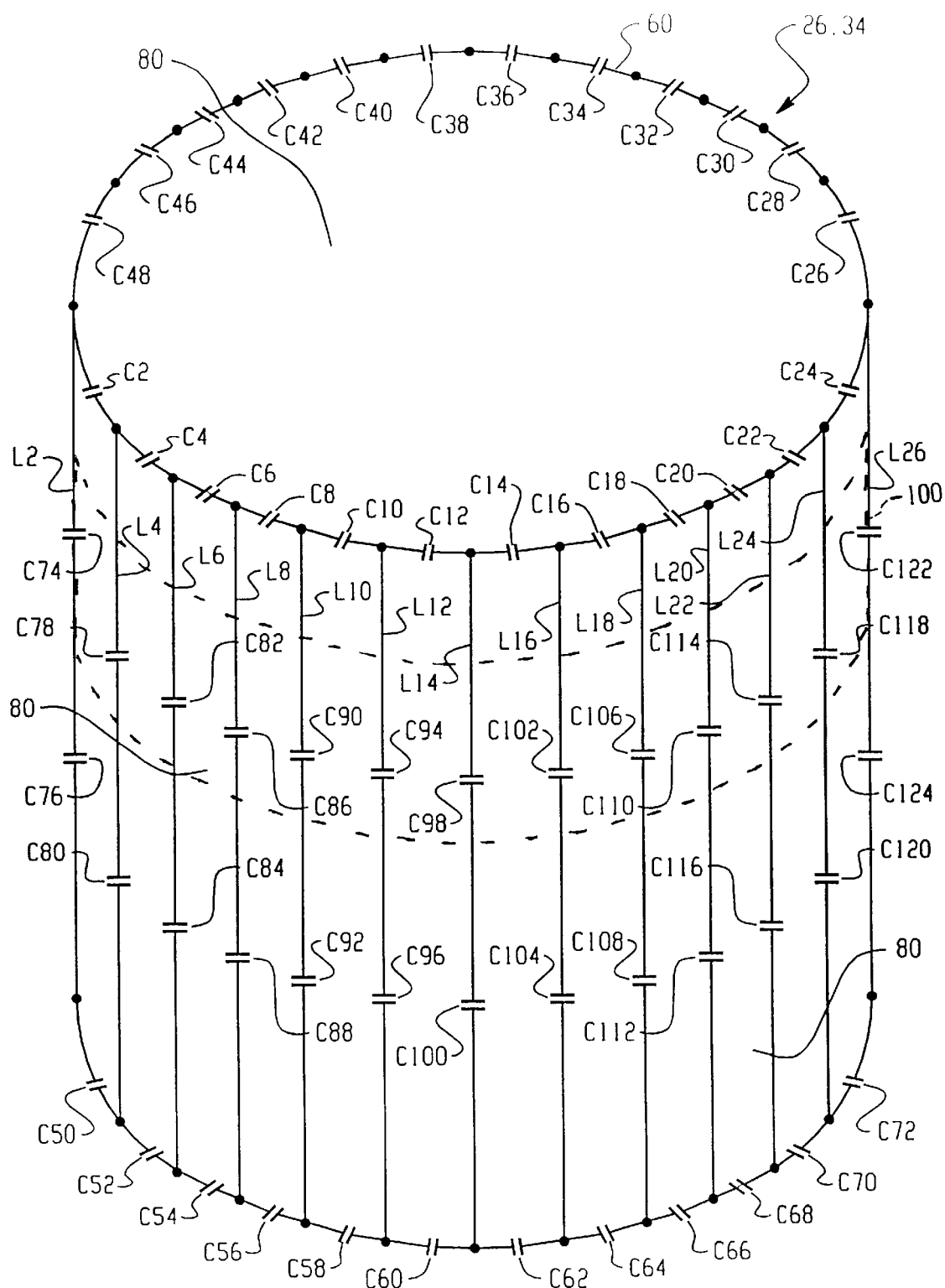
FIG. 2 is a diagrammatic illustration of a radio frequency transmitter coil in accordance with the present invention.

With reference to FIG. 2 and continued reference to FIG. 1, the preferred embodiment of the whole-body RF coil 26 and the local RF coil 34 are of the configuration often referred to as a "birdcage" coil. The birdcage coil 26, 34 has two end ring conductors 60, 62 which are disposed in a parallel and spaced-apart relation. The end ring conductors 60, 62 are interconnected by spaced leg conductors L2, L4, L6, . . ., L26. In two preferred embodiments, the birdcage radio frequency coil has either twenty or twenty-four evenly-spaced leg conductors. However, it is to be appreciated that the number of leg conductors may be more or less. Preferably, the birdcage coil contains a multiple of four (i.e.

4, 8, 12, etc.) leg conductors to facilitate quadrature operation. In the embodiment containing twenty leg conductors (not shown), each adjacent pair of leg conductors subtends an angle of 18 degrees on each end ring conductor 60, 62. In the embodiment employing 24 leg conductors (shown in FIG. 2), each adjacent pair of leg conductors subtends an angle of 15 degrees on each end ring conductor 60, 62. For structural stability and manufacturing simplicity, the birdcage coil is constructed on a dielectric support or former 80 which is cylindrical in shape. In the preferred embodiment, the dielectric support is constructed of resin-bonded fiberglass, ABS, or another plastic with low dielectric loss which does not contain free protons or other dipoles and in which magnetic resonance will be induced.

The end ring conductors 60, 62 and leg conductors L2, L4, L6, . . ., L26 are preferably copper foil strips. These copper strips are fastened to the former in a configuration corresponding to the preferred birdcage coil.

To combat the problem of local heating on the end ring capacitors, additional capacitors are added to the end ring conductors. The birdcage coil 26, 34 includes at least one capacitor between each adjacent pair of leg conductors L2 and L4, L4 and L6, . . ., L24, and L26 on each end ring conductor 60, 62. The first end ring conductor 60 is interrupted by capacitors C2, C4, C6, . . ., C48 and the second end ring conductor 62 is interrupted by capacitors C50, C52, . . ., C72. Preferably, each capacitor C2, C4, . . ., C72 is a combination of capacitors. Alternatively, local heating is reduced by adding more leg conductors to the RF coil. The addition of more leg conductors has the added benefit of improved homogeneity along the axis perpendicular to the coil axis. While the inclusion of additional capacitors helps reduce local heating, it renders tuning the coil to the desired resonant frequency more difficult.

RF birdcage transmitter coils generate RF signals near 64 MHZ in a 1.5 Tesla magnetic field for hydrogen dipoles. To combat further heating problems, capacitors are added to interrupt the leg conductors L2, L4, L6, . . ., L26 of the birdcage coil 26, 34 in order to reduce voltage on the coil and therefore, reduce heating. In the preferred embodiment, each leg conductor L2, L4, L6, . . ., L26 is interrupted by at least two symmetrically disposed capacitors C74 and C76, C78 and C80, . . ., C122 and C124. Preferably, each leg capacitor C74, C76, . . ., C124 is a parallel combination of capacitors. It is to be appreciated that greater or fewer than two capacitors may be connected to interrupt each leg conductor. The RF coil of the preferred embodiment is capable of generating an RF signal at 64 MHZ in a 1.5 T magnetic field. A similar coil is also capable of generating an RF signal at 128 MHZ in a 3.0 T magnetic field with a suitable selection of capacitors.

Figure 3A:
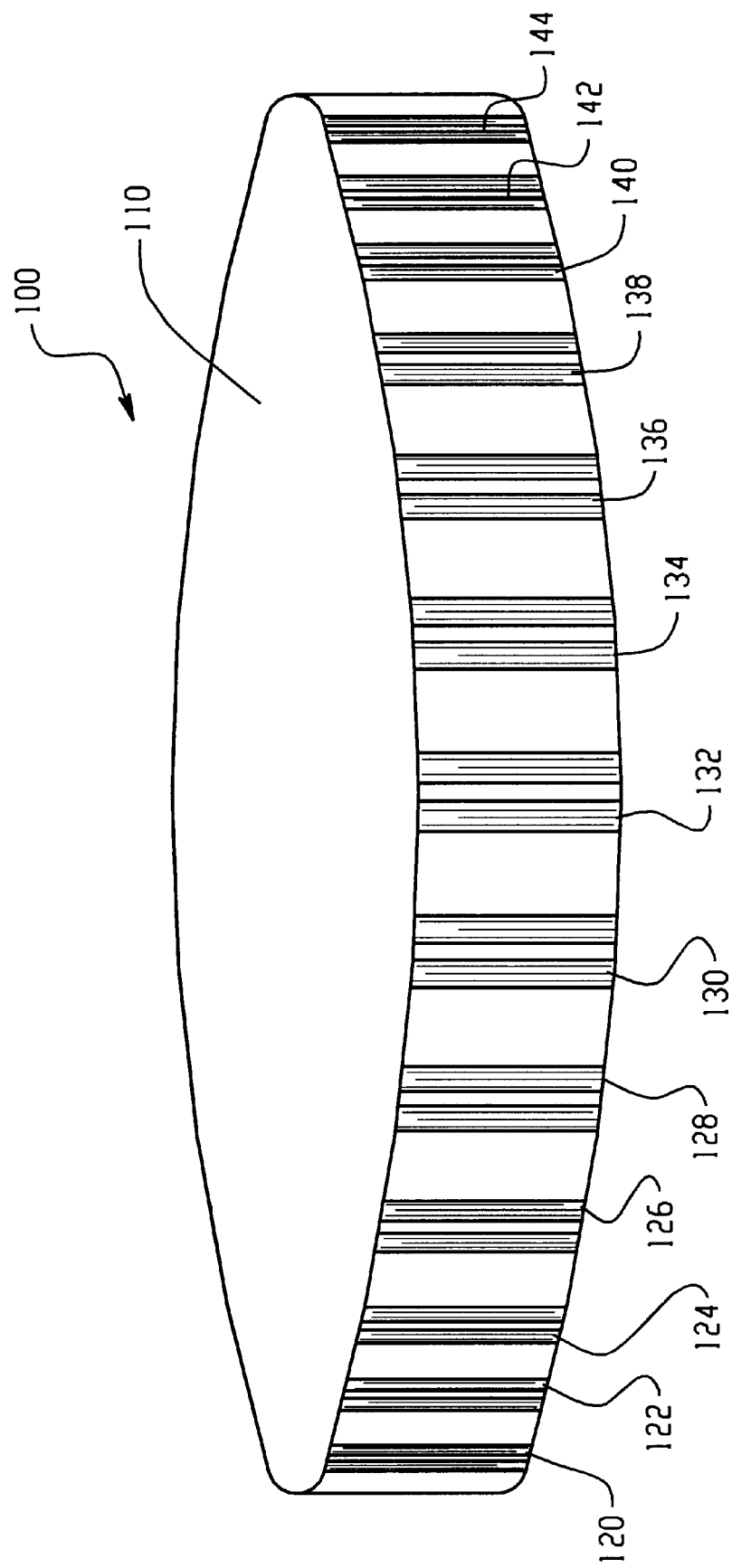
FIG. 3A is a diagrammatic illustration of a tuning ring for use in the radio frequency transmitter coil in accordance with the present invention.

While the birdcage coil 26, 34 of FIG. 2 is effective for reducing voltage and heating, it is difficult to change tuning. With reference to FIG. 3A and continued reference to FIG. 2, a tuning ring 100 is comprised of a non-conductive support cylinder 110 and a plurality of tuning band conductors or pads 120, 122, 124, . . ., 144. When the birdcage coil is circularly cylindrical, the support cylinder 110 can be a rigid circular ring or a flexible ring. If the birdcage coil is an elliptical cylinder, the support cylinder 110 is flexible. The tuning band conductors 120, 122, 124, . . ., 144 are preferably made of copper foil and have an axially extending gap in the center of each, as shown. As will be explained later, the axially extending gaps reduce inductive coupling. The tuning bands 120, 122, 124, . . ., 144 are mounted to the outer surface of a non-conductive support cylinder 110 such that they extend axially along the outer surface of the non-conductive support cylinder. Preferably, the copper foil tuning bands 120, 122, 124, . . ., 144 are substantially the same width as the copper foil leg conductors L2, L4, L6, . . ., L26. This similarity in width maximizes the tuning range of the RF coil. In addition, there are the same number of tuning bands 120, 122, 124, . . ., 144 on the tuning ring 100 as leg conductors L2, L4, L6, . . ., L26 on the birdcage coil 26, 34 and the tuning bands 120, 122, 124, . . ., 144 and leg conductors L2, L4, L6, . . ., L26 are spaced in substantially the same manner. This configuration provides the greatest tuning range for the coil. In the preferred embodiment, the non-conductive support cylinder 110 is made of a suitable flexible material.

Figure 3B:
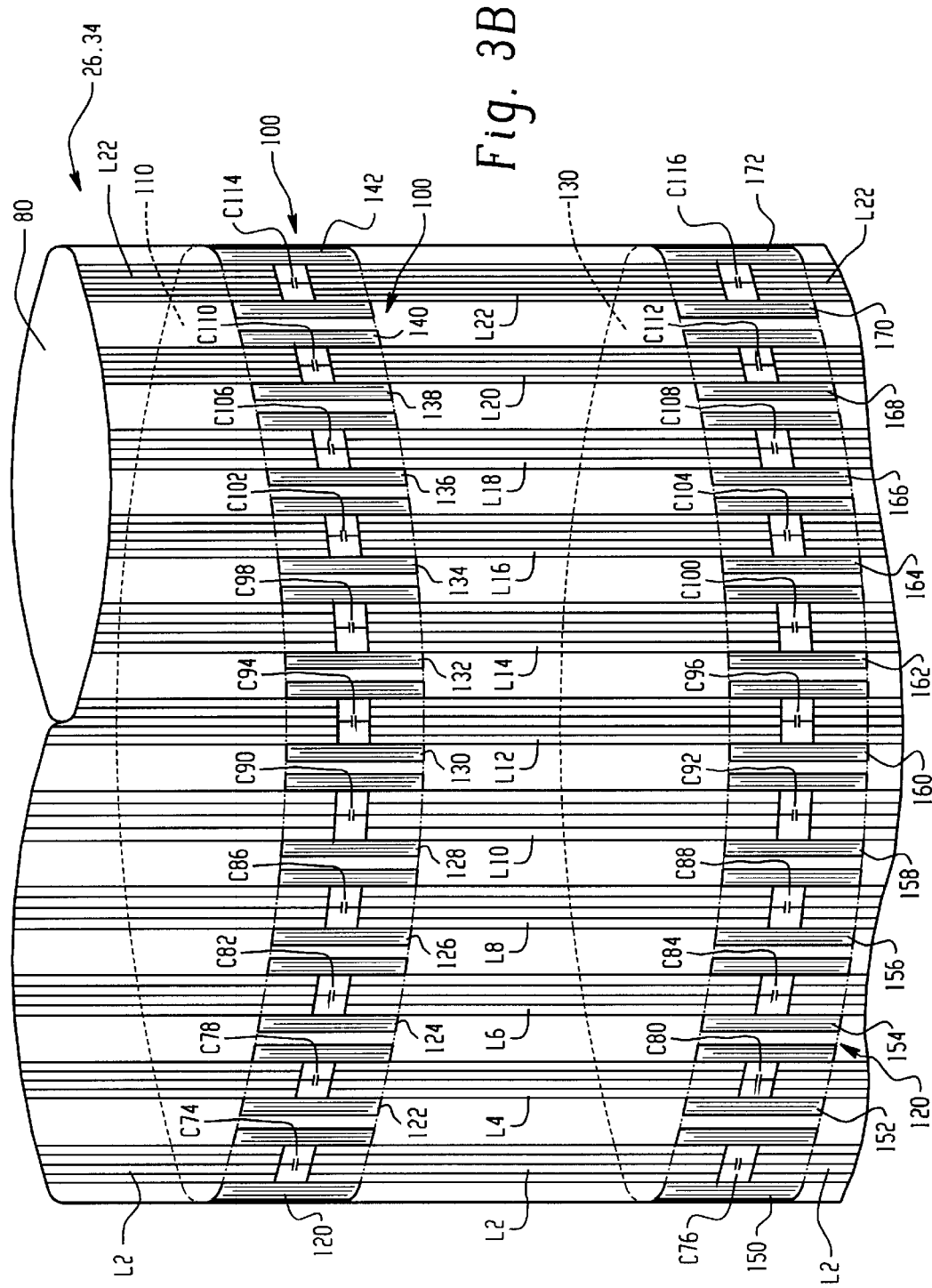
FIG. 3B is a diagrammatic illustration of the preferred embodiment of the tuning rings symmetrically disposed within the radio frequency transmitter coil in accordance with the present invention.

With reference to FIG. 3B and continued reference to FIGS. 2 and 3A, a front perspective view of two tuning rings 100, 120 mounted inside the birdcage coil 26, 34 is provided (end rings and capacitors not shown). The tuning rings 100, 120 are mounted on the inside surface of the dielectric support or former 80 such that the copper foil tuning bands 120, 122, 124, . . ., 142 and 150, 152, . . ., 172 of the tuning rings 100, 120 are in close proximity, preferably in direct contact with the inside surface of the former 80. The tuning rings 100, 120 are releasably fixed, e.g. taped, to the inner surface of the former 80 for easy future adjustment. It is to be appreciated that the tuning rings 100, 120 may be affixed to the inner surface of the former 80 by a variety of different means. This configuration prevents shorting out the leg conductors L2, L4, L6, . . ., L22 with a tuning band because the former 80 electrically insulates the tuning bands 120, 122, 124, . . ., 142 and 150, 152, . . ., 172 from the leg conductors L2, L4, L6, . . ., L22. Alternately, the tuning rings 100, 120 may be mounted to the outside of the birdcage coil 26, 34.

The tuning rings 100, 120 may be translated and/or rotated to tune the RF birdcage coil 26, 34 to the desired resonant frequency. Adjusting the tuning rings 100, 120 uniformly affects the amount of overlap between each end of each tuning band element 120, 122, 124, . . ., 142 and 150, 152, . . ., 172 and the corresponding leg conductor L2, L4, L6, . . ., L22 to adjust the effective capacitance, hence the resonant frequency of the RF coil 26, 34. The tuning rings 100, 120 provide a mutual tuning benefit which results in a wider tuning range. Translation of the tuning rings from one end ring toward the other end ring as well as rotation of the tuning ring about the coil's longitudinal axis affects both the capacitance and the inductance of the leg conductors L2, L4, L6, . . ., L22. Preferably, the tuning rings 100, 120 are translated such that the center of each ring 100, 120 is over the capacitors interrupting the leg conductors (as shown). In this manner, the tuning ring 100 adds additional capacitance in parallel with each of the leg capacitors. When the tuning rings 100, 120 are positioned such that there is virtually no overlap of the tuning bands 120, 122, 124, . . ., 142 and 150, 152, . . ., 172 and leg conductors L2, L4, . . ., L22, the leg capacitors determine the leg capacitance, hence the resonant frequency.

Figure 4A:
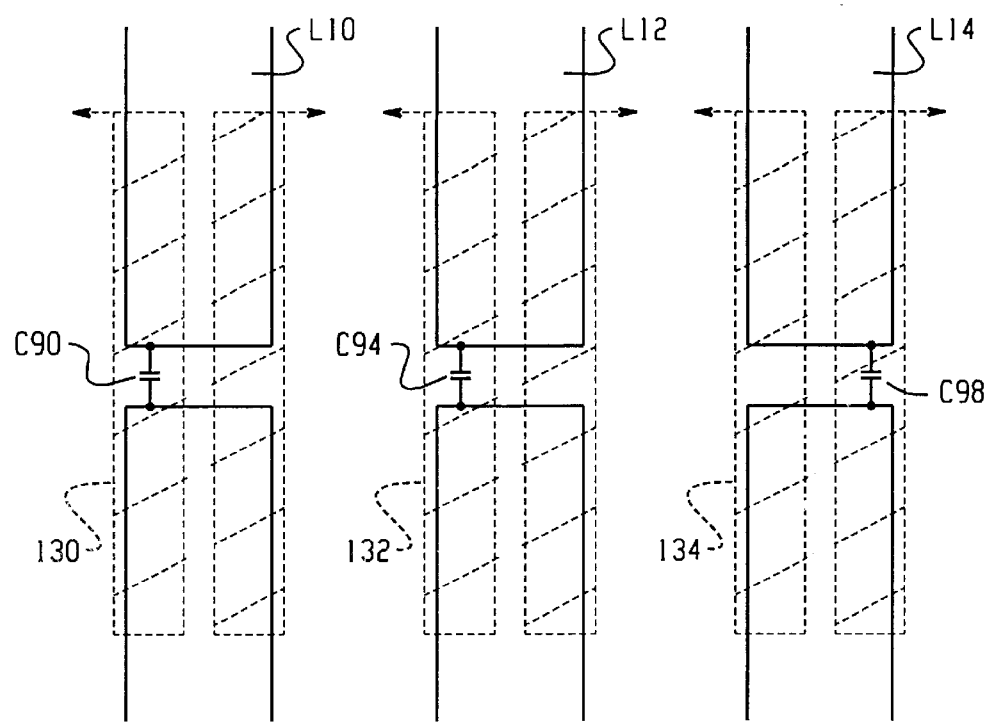
FIGS. 4A and 4B are exemplary illustrations showing the tuning range of the radio frequency transmitter coil in response to changes in the position of the tuning ring.
Figure 4B:
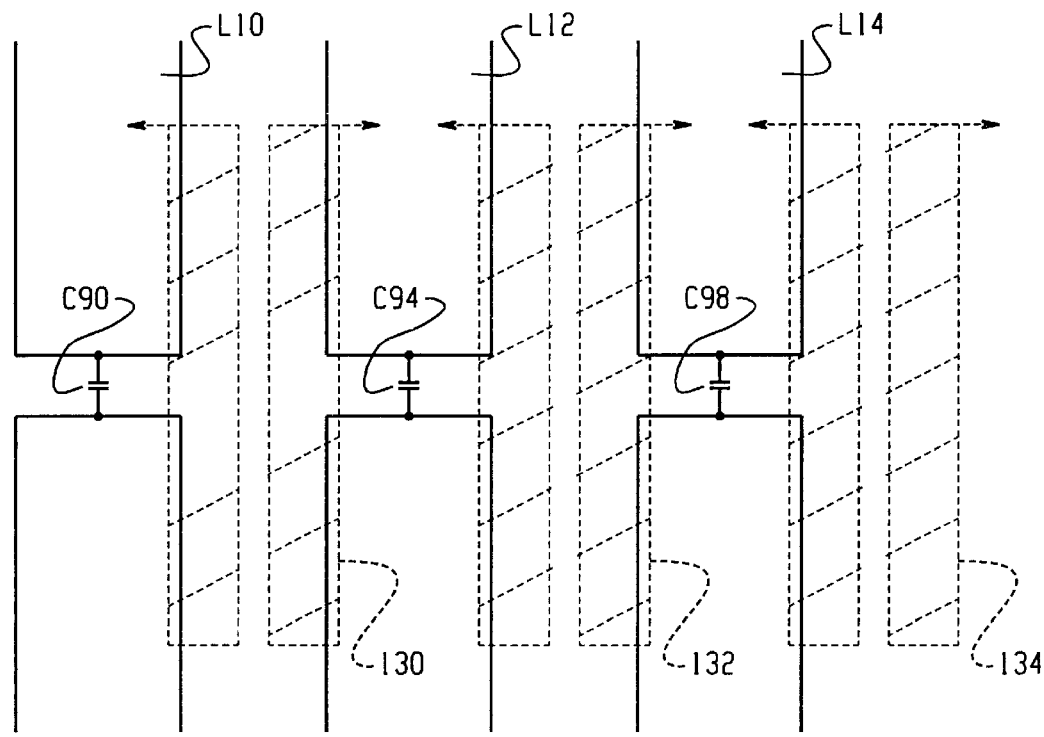

With reference to FIGS. 4A and 4B and continuing reference to FIGS. 2, 3A, and 3B, magnified views of the tuning band conductors 130, 132, 134 and leg conductors L10, L12, L14 are provided with the tuning band conductors 130, 132, 134 being in different positions relative to the leg conductors L10, L12, L14. Rotation of the tuning ring 100 in proximity to the leg conductors L10, L12, L14 and capacitances C90, C94, C98 within the leg conductors L10, L12, L14 adjusts the capacitive coupling through the tuning ring elements 130, 132, 134 to tune the resonant frequency of the transmitter coil 26, 34. FIG. 4A illustrates a tuning configuration where the tuning ring 100 has been rotated such that there is virtually a complete overlap of each individual tuning band 130, 132, 134 and each leg conductor L10, L12, L14 where the center of each tuning band 130, 132, 134 is behind each corresponding capacitor C90, C94, C98, as shown in FIG. 4A. It is to be appreciated that the second tuning ring 120 (not shown) can be rotated independently or in conjunction with the first tuning ring 100. In this position, the capacitive coupling is maximized and overall capacitance of the coil 26, 34 is increased due to the change in capacitive coupling caused by each individual tuning band 130, 132, 134 overlapping each capacitor C90, C94, C98 within each leg conductor L10, L12, L14. The increase in capacitance is a direct result of the overlap of the tuning bands 130, 132, 134 and respective leg conductors L10, L12, L14. The increase in overall capacitance of the coil 26, 34 results in a lower resonant frequency for the transmission coil 26, 34. This positioning of the tuning ring 100 provides the minimum resonant frequency for the coil 26, 34 of the available range for the given coil capacitances and does not change the inductance of the coil 26, 34.

FIG. 4B illustrates a tuning configuration where the tuning ring 100 has been rotated such that there is minimal overlap between the tuning bands 130, 132, 134 of the tuning ring 100 and the leg conductors L10, L12, L14 of the coil 34. This tuning configuration is also represented in FIG. 3B. With the tuning ring 100 in this position, there is minimal capacitive coupling because there is minimal overlap between the copper foil tuning bands 130, 132, 134 and the copper foil leg conductors L10, L12, L14 containing the corresponding capacitors C90, C94, C98. This configuration results in a decrease in the inductance of the birdcage coil 26, 34. Preferably, each tuning band conductor 130, 132, 134 contains an axially extending gap, as shown, or a plurality of axial interruptions in order to reduce inductive coupling. The coil inductance decreases because the tuning bands 130, 132, 134 damp eddy currents in each leg conductor L10, L12, L14. A decrease in inductance coupled with virtually no change in coil capacitance leads to an increase in the resonant frequency of the coil 26, 34. The tuning configuration depicted in FIG. 4B illustrates the maximum resonant frequency of the birdcage coil. FIGS. 4A and 4B represent the situations of maximum and minimum resonant frequency of the available range for a given set of coil capacitances and it should be apparent to one skilled in the art that rotating the tuning ring 100 into positions between the two extremes illustrated in FIGS. 4A and 4B will result in a variety of resonant frequencies which fall between the aforementioned maximum and minimum resonant frequencies.

It will be appreciated that each end of the tuning strips are capacitively coupled to a segment of the leg to provide two capacitances in series. Longitudinally translating the tuning ring also adjusts these two capacitive couplings and the resonance frequency of the coil. Because the overlap between the tuning ring pads and the leg conductors also alters their inductance, positioning the tuning ring along the legs away from the leg capacitors also affects frequency.

It will be further appreciated that one or more tuning rings may be employed to tune the reactive elements which interrupt one or more of the end ring conductors. Such tuning rings are analogous in structure to the aforementioned tuning rings. Each has conductive elements or pads which are disposed adjacent to the reactive elements and capacitively and inductively coupled to the end rings. Optionally, each of the tuning band conductors or conductive pads include circumferentially extending gaps. Rotation (and/or translation) of the leg and end ring tuning rings provides enhanced tuning.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A magnetic resonance apparatus having a main magnet which generates a main magnetic field through an examination region, a continuously tunable RF transmitter coil positioned about the examination region such that it excites magnetic resonance dipoles therein, an RF coil assembly which receives magnetic resonance signals from the resonating dipoles, a radio frequency transmitter which drives the tunable RF transmitter coil, a receiver connected to the RF coil assembly which receives and demodulates the magnetic resonance signals, the continuously tunable RF transmitter coil comprising:

a pair of end ring conductors disposed in parallel planes, said end ring conductors interrupted by a plurality of reactive elements;

a plurality of spaced leg conductors connecting said end ring conductors to form a generally cylindrical volume, said leg conductors each interrupted by at least one reactive element; and at least one tuning ring for continuously (i) inductively tuning the leg conductors, and (ii) capacitively tuning the reactive elements interrupting the leg conductors, said tuning ring comprising:
  a non-conductive support cylinder having an outer surface and an inner surface, and
  a plurality of tuning band conductors which extend axially along said non-conductive support cylinder, such that rotating the non-conductive support adjusts a degree to which the conductors overlap and capacitively couple to the leg conductors.

2. The magnetic resonance apparatus according to claim 1, wherein the leg conductors are each interrupted by at least two symmetrically disposed reactive elements.

3. The magnetic resonance apparatus according to claim 2, wherein the tunable RF transmitter coil further comprises a pair of tuning rings for tuning the reactive elements interrupting the leg conductors.

4. The magnetic resonance apparatus according to claim 1, wherein the tunable RF transmitter coil further includes:
at least one tuning ring for tuning the reactive elements interrupting at least one of the end ring conductors.

5. The magnetic resonance apparatus according to claim 1, wherein the tunable RF transmitter coil further comprises a dielectric former having an outer surface and an inner surface, where said end ring conductors and said leg conductors are mounted on the outer surface of said dielectric former.

6. The magnetic resonance apparatus according to claim 5, wherein said tuning ring is adjustably secured to the inner surface of said dielectric former such that said tuning band conductors are in direct contact with the inner surface of the dielectric former.

7. The magnetic resonance apparatus according to claim 1, wherein said end ring conductors, said leg conductors, and said tuning band conductors include copper strips.

8. The magnetic resonance apparatus according to claim 1, wherein the leg conductors are evenly spaced along the end ring conductors.

9. The magnetic resonance apparatus according to claim 1, wherein the tuning band conductors on the tuning ring are equal in number to the leg conductors.

10. A magnetic resonance apparatus having a main magnet which generates a main magnetic field through an examination region, a tunable RF transmitter coil positioned about the examination region such that it excites magnetic resonance dipoles therein, a radio frequency transmitter which drives the tunable RF transmitter coil, a receiver connected which receives and demodulates received magnetic resonance signals, the tunable RF transmitter coil comprising:
   a pair of end ring conductors disposed in parallel planes, said end ring conductors interrupted by a plurality of reactive elements;
   a plurality of spaced leg conductors connecting said end ring conductors to form a generally cylindrical volume, said leg conductors each interrupted by at least one reactive element; and,
   at least one tuning ring for tuning the reactive elements interrupting the leg conductors, said tuning ring comprising:
      a non-conductive support cylinder having an outer surface and an inner surface, and
      a plurality of tuning band conductors which couple capacitively with the leg conductors and which extend axially along said non-conductive support cylinder, the tuning band conductors each containing an axially extending gap.

11. The magnetic resonance apparatus according to claim 1, wherein the leg conductors a and the tuning band conductors are metal strips of substantially the same width.

12. The magnetic resonance apparatus according to claim 1, wherein the reactive elements are capacitors.

13. A method for tuning a radio frequency coil used in a magnetic resonance apparatus, which coil includes spaced leg conductors electrically connected between two end rings disposed in a parallel spaced-apart relation, the end rings having at least one capacitance between each adjacent pair of leg conductors, and the leg conductors each being interrupted by at least one capacitance, said method comprising:
   (a) positioning a tuning ring containing conductive tuning pads within a central region of the coil in proximity to the capacitances in the leg conductors; and
   (b) rotating and translating the tuning ring in relation to the leg conductors and capacitances to continuously adjust capacitive coupling of and current transfer through the pads and continuously adjust a resonance frequency of the coil.

14. A method for tuning a radio frequency coil used in a magnetic resonance apparatus, which coil includes spaced leg conductors electrically connected between two end rings disposed in a parallel spaced-apart relation, the end rings having at least one capacitance between each adjacent pair of leg conductors, and the leg conductors each being interrupted by at least two symmetrically disposed capacitances, said method comprising:
   (a) positioning a pair of tuning rings containing conductive tuning pads in proximity to the at least two symmetrically disposed capacitances in each leg conductor and capacitively coupled to portions of each leg conductors adjacent to the capacitances; and
   (b) moving the tuning ring in relation to the leg conductors and capacitances to adjust a degree of capacitive coupling and a resonance frequency of the coil.

15. A method for tuning a radio frequency coil used in a magnetic resonance apparatus, which coil includes spaced leg conductors electrically connected between two end rings disposed in a parallel spaced-apart relation, the end rings having at least one capacitance between each adjacent pair of leg conductors, and the leg conductors each being interrupted by at least one capacitance, said method comprising:
   (a) positioning a tuning ring containing conductive tuning pads having axially extending gaps in proximity to a central region of the leg conductors; and
   (b) providing eddy current paths by at least one of rotating and translating the tuning ring in relation to the leg conductors to reduce the inductance of the coil, thereby adjusting the resonance frequency.

16. The method according to claim 14, further including continuously rotating the tuning ring to select among a continuum of resonance frequencies.

17. A radio frequency coil for a magnetic resonance apparatus, the radio frequency coil comprising:
   a pair of end ring conductors which are connected by a plurality of parallel, spaced leg conductors arranged in a circumferential array, said end ring conductors and leg conductors being interrupted by a plurality of capacitances; and
   at least one conductive tuning ring movably positioned parallel to the end rings adjacent the leg conductors, said at least one conductive tuning ring being capacitively and inductively coupled to the leg conductors such that longitudinally translating the at least one conductive tuning ring tunes a frequency of said radio frequency coil.

18. A radio frequency coil for a magnetic resonance apparatus, the radio frequency coil comprising:
   a pair of end ring conductors which are connected by a plurality of parallel, spaced leg conductors arranged in a circumferential array, said end ring conductors and leg conductors being interrupted by a plurality of capacitances; and
   a pair of conductive tuning rings movably positioned parallel to the end rings adjacent the leg conductors in a capacitively and inductively coupled relationship to said leg conductors such that translating and rotating the tuning ring tunes a frequency of said radio frequency coil, wherein each tuning ring includes:
      a plurality of electrically conductive pads, said electrically conductive pads each containing an axially extending gap.

19. The radio frequency coil according to claim 18, wherein the tuning ring conductive pads are equal in number to the leg conductors.

20. The radio frequency coil according to claim 19, wherein said leg conductors and said tuning ring conductive pads are metal strips and the leg conductor metal strips and the tuning ring metal strips are substantially the same width.

21. The radio frequency coil according to claim 18, wherein:
   the radio frequency coil further includes a dielectric former on which said end ring conductors and said leg conductors are mounted; and
   the tuning rings each include a dielectric former on which said conductive pads are mounted, the tuning rings being mounted for at least one of rotating and translating movement along one of an inner surface and an outer surface of the radio frequency coil.

* * * * *